US011335765B2

(12) United States Patent
Xie et al.

(10) Patent No.: US 11,335,765 B2
(45) Date of Patent: May 17, 2022

(54) DISPLAY PANELS, DISPLAY SCREENS, AND DISPLAY TERMINALS

(71) Applicant: Yungu (Gu'an) Technology Co., Ltd., Langfang (CN)

(72) Inventors: Zhengfang Xie, Kunshan (CN); Junhui Lou, Kunshan (CN); Yanqin Song, Kunshan (CN); Yanan Ji, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/816,272

(22) Filed: Mar. 12, 2020

(65) Prior Publication Data

US 2020/0212164 A1    Jul. 2, 2020

Related U.S. Application Data

(63) Continuation of application No. PCT/CN2019/073506, filed on Jan. 28, 2019.

(30) Foreign Application Priority Data

Aug. 6, 2018  (CN) .......................... 201810887646.4

(51) Int. Cl.
*H01L 27/32* (2006.01)
(52) U.S. Cl.
CPC ........ *H01L 27/3286* (2013.01); *H01L 27/326* (2013.01); *H01L 27/3227* (2013.01); *H01L 27/3234* (2013.01)

(58) Field of Classification Search
CPC ..... H01L 27/3234; H01L 27/3244–329; H01L 51/5209; H01L 51/5225
See application file for complete search history.

(56) References Cited

U.S. PATENT DOCUMENTS

| 4,342,031 A | 7/1982 | Lapeyre |
| 4,665,342 A | 5/1987 | Topp et al. |
| 7,656,488 B2 | 2/2010 | Kazuyoshi et al. |

(Continued)

FOREIGN PATENT DOCUMENTS

| CN | 1346120 A | 4/2002 |
| CN | 1991463 A | 7/2007 |

(Continued)

OTHER PUBLICATIONS

International Search Report dated May 7, 2019 in the corresponding international application (application No. PCT/CN2019/073506).

(Continued)

*Primary Examiner* — Daniel P Shook
(74) *Attorney, Agent, or Firm* — Kilpatrick Townsend & Stockton

(57) ABSTRACT

A display panel, a display screen, and a display terminal are provided. The display panel includes a substrate and a plurality of wavy first electrodes disposed on the substrate. The plurality of first electrodes extend in parallel in the same direction and have an interval between adjacent first electrodes. In an extending direction of the first electrode, a width of the first electrode changes continuously or intermittently, and the interval changes continuously or intermittently.

21 Claims, 13 Drawing Sheets

(56) References Cited

U.S. PATENT DOCUMENTS

| | | | |
|---|---|---|---|
| 2002/0039003 A1 | 4/2002 | Inoue | |
| 2005/0168678 A1 | 8/2005 | Andou et al. | |
| 2006/0170111 A1* | 8/2006 | Isa | H01L 21/288 257/775 |
| 2011/0163318 A1* | 7/2011 | Park | H01L 27/326 257/59 |
| 2013/0050105 A1 | 2/2013 | Lee et al. | |
| 2013/0168138 A1 | 7/2013 | Yamazaki et al. | |
| 2014/0063370 A1 | 3/2014 | Ko et al. | |
| 2014/0092323 A1 | 4/2014 | Hwang et al. | |
| 2014/0291008 A1 | 10/2014 | Huang | |
| 2014/0375903 A1 | 12/2014 | Westhues et al. | |
| 2015/0279271 A1* | 10/2015 | Xi | G09G 3/3233 345/211 |
| 2018/0196557 A1 | 7/2018 | Zhang et al. | |
| 2018/0212060 A1 | 7/2018 | Kang et al. | |
| 2019/0130822 A1* | 5/2019 | Jung | H01L 27/3227 |

FOREIGN PATENT DOCUMENTS

| | | |
|---|---|---|
| CN | 100541278 C | 9/2009 |
| CN | 102622151 A | 8/2012 |
| CN | 103080876 A | 5/2013 |
| CN | 103336609 A | 10/2013 |
| CN | 104409469 A | 3/2015 |
| CN | 105264772 A | 1/2016 |
| CN | 105556444 A | 5/2016 |
| CN | 205247019 U | 5/2016 |
| CN | 106020527 A | 10/2016 |
| CN | 106030371 A | 10/2016 |
| CN | 103765356 B | 12/2016 |
| CN | 207397674 U | 5/2018 |
| JP | H11191491 A | 7/1999 |
| JP | 2001051621 A | 2/2001 |
| JP | 2001196171 A | 7/2001 |
| JP | 2001237083 A | 8/2001 |
| JP | 2003311196 A | 11/2003 |
| JP | 2004206923 A | 7/2004 |
| JP | 2006237586 A | 9/2006 |
| JP | 2007249170 A | 9/2007 |
| JP | 2012070356 A | 4/2012 |
| WO | 2014192755 A1 | 12/2014 |

OTHER PUBLICATIONS

TW First Office Action with search report dated Nov. 29, 2019 in the corresponding TW application (application No. 108108328).
Notice of Allowance of Chinese Patent Application No. 201810887646.4.
Office Action of TW Patent Application No. 108108328.
Office Action of Chinese Patent Application No. 201810887646.4.
Supplementary European Search Report of EP Patent Application No. 19848345.5.
Office Action of KR Patent Application No. 10-2020-7016210.
Office Action of JP Patent Application No. 2020-547278.

* cited by examiner

DISPLAY PANELS, DISPLAY SCREENS, AND DISPLAY TERMINALS

CROSS-REFERENCES TO RELATED APPLICATIONS

This application is a continuation application of International Application PCT/CN2019/073506, filed on Jan. 28, 2019, which claims the priority benefit of Chinese Patent Application No. 201810887646.4, titled "DISPLAY PANELS, DISPLAY SCREENS AND DISPLAY TERMINALS" and filed on Aug. 6, 2018. The entireties of these applications are incorporated by reference herein for all purposes.

TECHNICAL FIELD

The present disclosure relates to the field of display technologies.

BACKGROUND

With the rapid development of electronic devices, the requirements of users on screen-to-body ratios become increasingly higher, so that the full-screen display of the electronic devices receives more and more attention in the industry. Conventional electronic devices, such as mobile phones, tablet PC, and the like, require to integrate components such as a front-facing camera, an earphone, an infrared sensing element, and the like, so that the full-screen display of the electronic device can be achieved by notching on the display screen and providing a transparent display screen in the notched area. However, when a photosensitive device such as a camera is disposed under the display panel, a photographed image often appears to be highly blurred.

SUMMARY

According to various embodiments of the present disclosure, a display panel, a display screen, and a display terminal are provided.

A display panel includes a substrate and a plurality of wavy first electrodes disposed on the substrate. The plurality of first electrodes extend in parallel in the same direction and have an interval between adjacent first electrodes. In an extending direction of the first electrode, a width of the first electrode changes continuously or intermittently, and the interval changes continuously or intermittently.

Optionally, both sides of the first electrode in the extending direction are wavy. Crests of the two sides are oppositely disposed, and troughs of the two sides are oppositely disposed.

Optionally, a connecting portion is disposed at the opposite troughs of the first electrode, and the connecting portion has a strip shape.

Optionally, the display panel is a passive-matrix organic light-emitting diode (PMOLED) display panel. The display panel further includes a second electrode stacked with the first electrode, and an extending direction of the second electrode is perpendicular to the extending direction of the first electrode.

Optionally, the first electrode is an anode, the second electrode is a cathode. Each anode is configured to drive a row/column of sub-pixels or a plurality of rows/columns of sub-pixels.

Optionally, each anode is configured to drive a row/column of pixels. One pixel includes at least three sub-pixels. A width between opposite crests of two sides of the anode is within 30 micrometers to (A-X) micrometers. A width between opposite troughs of two sides of the anode is greater than X and less than the width between the opposite crests. A is a pixel size, X is a minimum process dimension, and the A is greater than or equal to (30+X) micrometers.

Optionally, each anode is configured to drive a row/column of sub-pixels. A width between opposite crests of two sides of the anode ranges from X micrometers to ((A−X)/N) micrometers. A width between opposite troughs of two sides of the anode is greater than X and less than the width between the opposite crests. A is a pixel size. X is a minimum process dimension. N is equal to the number of columns/rows of the sub-pixels included in each pixel.

Optionally, a shape of the cathode is the same as a shape of the anode.

Optionally, the number of rows/columns of the sub-pixels driven by one anode is N, the number of columns/rows of the sub-pixels driven by one cathode is M, and N is greater than or equal to 3 times of M.

Optionally, both sides of the cathode in an extending direction thereof are wavy. Crests of the two sides are oppositely disposed, and troughs of the two sides are oppositely disposed. A connecting portion is disposed at the opposite troughs of the cathode. The connecting portion has a strip shape.

Optionally, the number of columns/rows of pixels driven by one cathode is equal to the number of rows/columns of pixels driven by one anode. A width W3 between the opposite crests of the two sides of the cathode is (W1−X) micrometers. A width W4 of the connecting portion of the cathode is greater than X and less than the width between the opposite crests of the cathode. W1 is a width between opposite crests of two sides of the anode, X is a minimum process dimension.

Optionally, the number of rows/columns of the sub-pixels driven by one anode is N, the number of columns/rows of the sub-pixels corresponding to one cathode is M and N is greater than or equal to 3 times of M. The width between the opposite crests of the two sides of the cathode ranges from X micrometers to ((A−X)/3) micrometers. The width of the connecting portion of the cathode is greater than X and less than the width between the opposite crests of the cathode. A is a pixel size and X is a minimum process dimension.

Optionally, X is 4 micrometers.

Optionally, the display panel is an active-matrix organic light-emitting diode (AMOLED) display panel. The substrate is a thin film transistor (TFT) array substrate. The first electrode includes various conductive traces on the TFT array substrate. The conductive trace includes at least one of a scanning line, a data line, and a power line.

Optionally, the display panel further includes an anode layer disposed above the substrate. The anode layer includes an anode array. The anode has a circular shape, elliptical shape, or dumbbell shape.

Optionally, the first electrode is provided with a plurality of protrusions distributed along an edge of the first electrode.

A display screen has at least one display area. The at least one display area includes a first display area. A photosensitive device may be disposed under the first display area.

The display panel according to any one of the aforementioned embodiments is disposed in the first display area. Each display area in the at least one display area is configured to display a dynamic or static picture.

Optionally, the at least one display area further includes a second display area. The display panel disposed in the first display area is a PMOLED display panel or an AMOLED display panel. The display panel disposed in the second display area is an AMOLED display panel.

A display terminal includes a device body having a device area and the display screen according to any one of the aforementioned embodiments covering the device body. The device area is located under the first display area. A photosensitive device configured to collect light through the first display area is disposed in the device area.

Optionally, the device area is a notched area. The photosensitive device includes at least one of a camera and a light sensor.

DETAILED DESCRIPTION OF THE INVENTION

Reference will be made to the accompanying drawings and embodiments to describe the present disclosure in detail, so that the objects, technical solutions, and advantages of the present disclosure can be more apparent and understandable. It is understood that the specific embodiments described herein are merely illustrative of the present disclosure and are not intended to limit the present disclosure.

In the description of the present disclosure, it is to be understood that orientation or position relationships that are indicated by the terms "center", "transverse", "on", "under", "left", "right", "vertical", "horizontal", "top", "bottom", "inside", and "outside", and the like are orientation or position relationships shown based on the accompany drawings, and are merely for convenience of the description of the present disclosure and simplifying description, rather than indicating or implying that the indicated device or element must have a particular orientation or being constructed and operated in a particular orientation, and are therefore not to be construed as limitation of the present disclosure. In addition, it should be noted that when an element is referred to as being "formed on another element", it can be directly connected to the other element or intervening elements may be present. When an element is referred to as being "connected" to another element, it can be directly connected to the other element or intervening elements may be present. In contrast, if an element is referred to as being "directly on" another element, there are no intervening elements present.

When a photosensitive device such as a camera or the like is disposed under a transparent display panel, the photographed photos are easily to be blurred. This problem is due to the presence of conductive traces in the display screen body of electronic devices. External light can cause complex diffraction intensity distribution when passing through these conductive traces, resulting in diffraction fringes, which would then affect the normal operation of the photosensitive device such as a camera or the like. For example, when the camera located under the transparent display area is in operation, external light can be obviously diffracted after passing through the wire traces in the display screen, so that the picture photographed by the camera is distorted.

Figure 1:
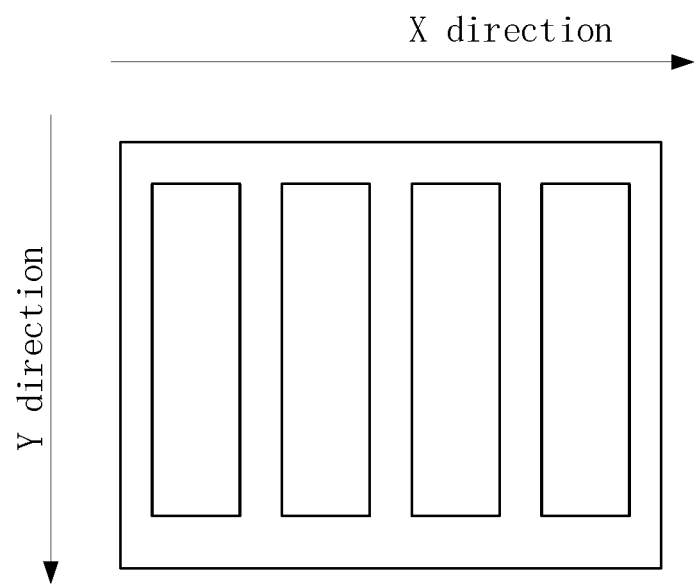
FIG. 1 is a schematic view of a conductive trace.

FIG. 1 is a schematic view of a conductive trace. Referring to FIG. 1, the conductive trace has a strip shape. Light propagates with varying degrees of bending and spreading when passing through obstacles such as slits, small holes, disks, or the like, thereby deviating from the original straight line, and such phenomenon is called diffraction. During diffraction, the distribution of diffraction fringes can be affected by the size of obstacles, such as the width of the slit, the size of the small hole, and the like. The diffraction fringes generated at the positions with the same width are identical in position, and a more significant diffraction effect appears. When light passes through the conventional display panel, since the display panel is provided with the strip-shaped conductive traces which are periodically arranged, the diffraction fringes generated at different positions have the same position, so that the obvious diffraction effect can be generated, and the normal operation of the photosensitive device disposed under the display panel is not facilitated.

Figure 2:
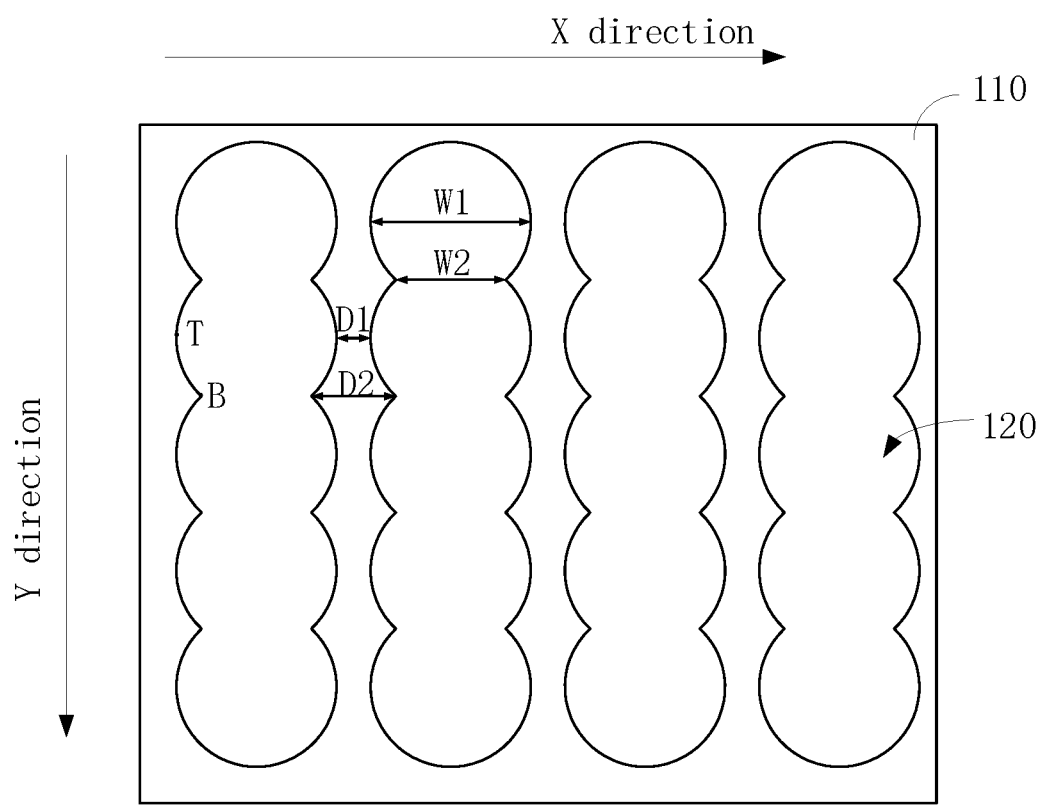
FIG. 2 is a schematic view of a display panel according to an embodiment.

In order to solve the aforementioned problem, an embodiment of the present disclosure provides a display panel, which can solve the aforementioned problem quite well. FIG. 2 is a schematic view of a display panel according to an embodiment. Referring to FIG. 2, the display panel includes a substrate 110 and a plurality of wavy first electrodes 120 disposed on the substrate 110. The plurality of first electrodes 120 extend in parallel in the same direction, and have an interval between adjacent first electrodes 120. In the present embodiment, since the first electrode 120 is wavy, the width thereof changes continuously or intermittently in an extending direction of the first electrode 120. The continuous change of the width means that the widths at any two adjacent positions of the first electrode 120 are different. In FIG. 2, the extending direction of the first electrode 120 refers to a length direction thereof, that is, the Y direction in the figure.

The width of the first electrode 120 (that is, the length of the first electrode 120 in the X direction in the figure) changes intermittently in the extending direction of the first electrode 120. And the intermittent change of the width means that the widths of two adjacent positions in a partial area of the first electrode 120 are the same, and the widths of two adjacent positions in a partial area are different. In the present embodiment, the plurality of first electrodes 120 are regularly arranged on the substrate 110, and thus, a gap between two adjacent first electrodes 120 also exhibits a continuous change or an intermittent change in a direction parallel to the extending direction of the first electrodes 120. The width of the first electrode 120 may change periodically in the extending direction thereof regardless of whether the width thereof changes continuously or intermittently, and the length of one change period may correspond to the width of one pixel.

The aforementioned display panel is provided with the plurality of wavy first electrodes 120. The width of the first electrode 120 changes continuously or intermittently in the extending direction thereof, so that adjacent first electrodes 120 have a continuously changing interval or an intermittently changing interval therebetween. Therefore, diffraction fringes generated at positions of different widths of the first electrodes 120 and different intervals of the adjacent first electrodes 120 are different in position. Diffraction effects at different positions are mutually counteracted, so that the diffraction effect can be effectively reduced, thereby ensuring that when a camera is disposed under the transparent display panel, the photographed graphics have higher definition.

Optionally, in order to improve light transmittance of the display panel, each conductive trace of the display panel is made of a transparent conductive metal oxide. For example, the first electrode 120 may be made of transparent conductive metal oxide. For example, the first electrode 120 may be made of indium tin oxide (ITO) or indium zinc oxide (IZO). In addition, in order to reduce the resistance of each conductive trace on the basis of ensuring high light transmittance, the first electrode 120 may also be made of materials such as aluminum-doped zinc oxide, silver-doped ITO, silver-doped IZO or the like.

Optionally, the first electrode 120 has a symmetrical structure in the extending direction thereof, as shown in FIG. 2. The setting of the width of the first electrode 120 directly affects the pixel openings in the display panel, thereby affecting the pixel opening ratio of the display panel. The first electrode 120 is arranged in a symmetrical structure, so that each pixel unit on the display panel can be ensured to have the same or similar opening ratio without causing the problem that the display effect of the display panel is affected due to a large difference of the opening ratios of the pixel units at different positions.

Figure 3:
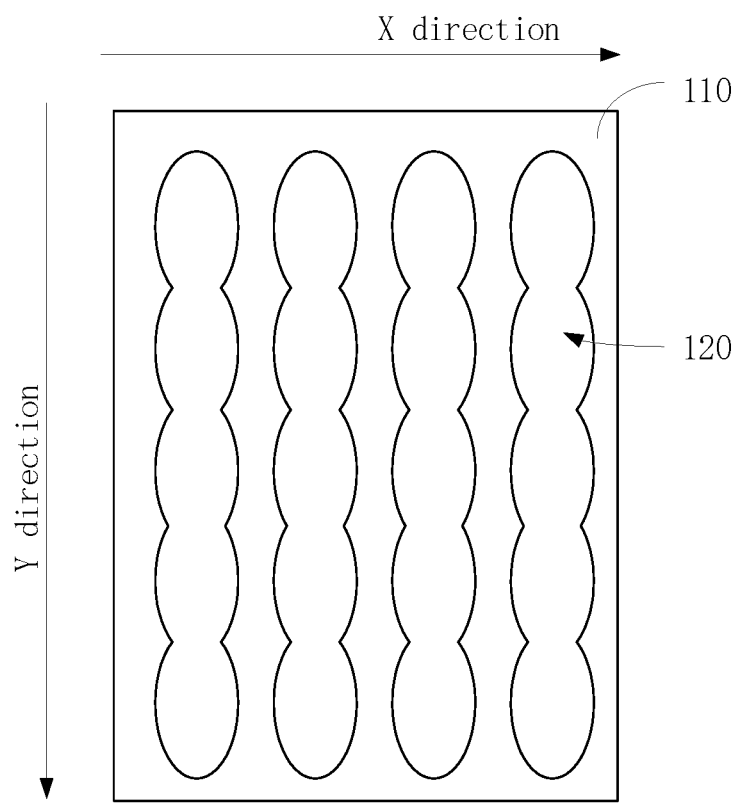
FIG. 3 is a schematic view of a display panel according to FIG. 2 with different shape of the first electrode.

Optionally, both sides of the first electrode 120 in the extending direction are wavy, as shown in FIG. 2. Crests T of the two sides in the extending direction are oppositely disposed, and troughs B of the two sides in the extending direction are oppositely disposed. In the present embodiment, the two sides are connected by circular arc-shaped sides with the same radius of curvature. Optionally, the two sides may also be connected by elliptical sides with the same radius of curvature, as shown in FIG. 3. By forming the two sides of the first electrode 120 into a wave shape formed by connecting circular arcs or ellipses, the diffraction fringes generated on the first electrode 120 can be ensured to be diffused in different directions, thereby reducing the diffraction effect.

Figure 4:
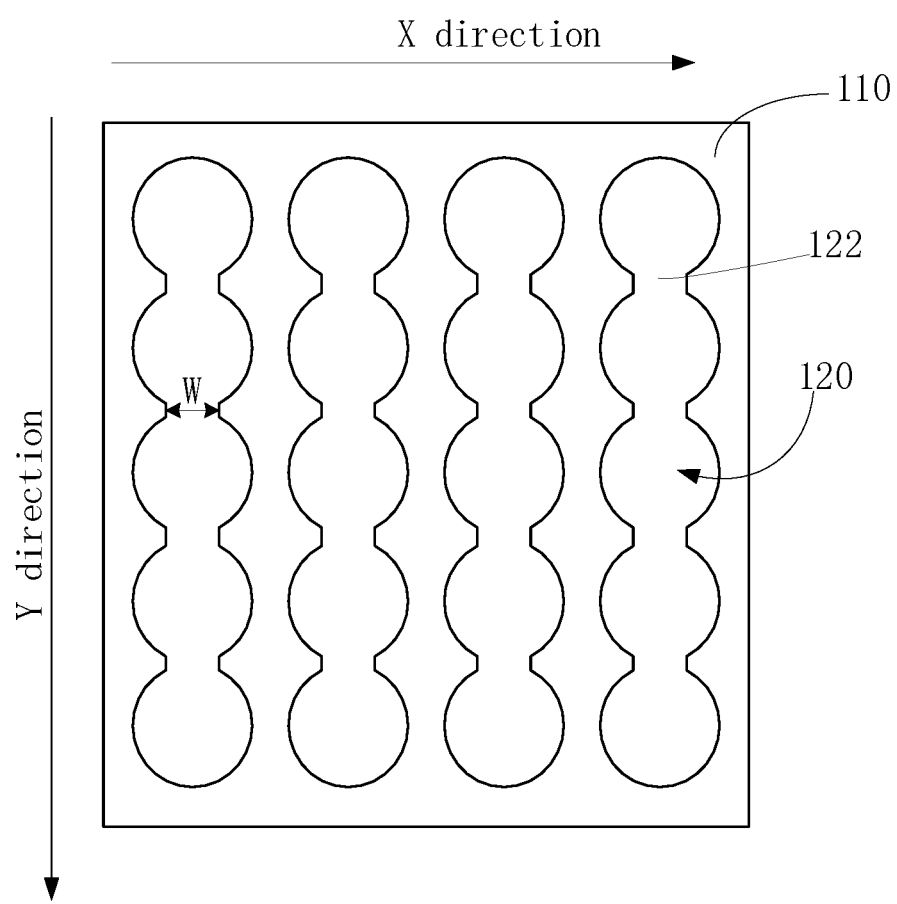
FIG. 4 is a schematic view of a display panel according to FIG. 2 with different shape of the first electrode.
Figure 5:
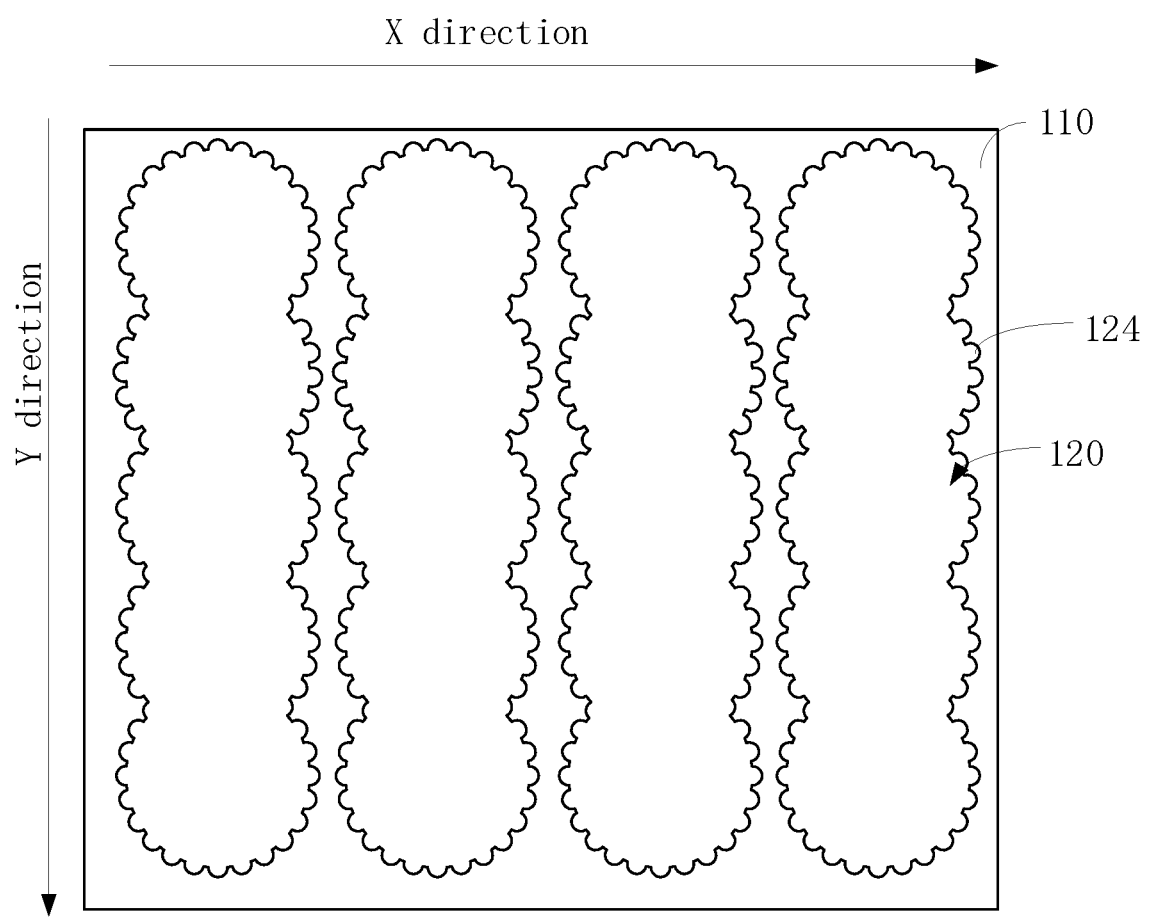
FIG. 5 is a schematic view of a display panel according to FIG. 2 with different shape of the first electrode.

Optionally, a connecting portion 122 is disposed at the opposite troughs of the first electrode 120, as shown in FIG. 4. The connecting portion 122 has a strip shape. A width W of the connecting portion 122 should be greater than X micrometers and less than the maximum width of the first electrode 120. X is a minimum process dimension, which is 4 micrometers in the present embodiment, and can be smaller in other embodiments. Optionally, an area between two adjacent connecting portions 122 on the first electrode 120 corresponds to one pixel opening, and the connecting portion 122 corresponds to a gap between two adjacent pixel openings. By adjusting the width W of the connecting portion 122, the resistance on the first electrode 120 can be adjusted so that it can meet the use requirement. Optionally, the connecting portion 122 may also have other irregular structures, such as a shape with a small middle and two large ends, or a shape with a large middle and two small ends. In another embodiment, the first electrode 120 is provided with a plurality of protrusions 124, as shown in FIG. 5. Sides of the plurality of protrusions 124 are straight lines and/or curves. In the present embodiment, the sides of the plurality of protrusions 124 are all curved. By providing the plurality of protrusions 124 on the first electrode 120, the uniformity distribution of the width at each position of the first electrode 120 can be further disturbed, thereby reducing the diffraction effect.

Figure 6:
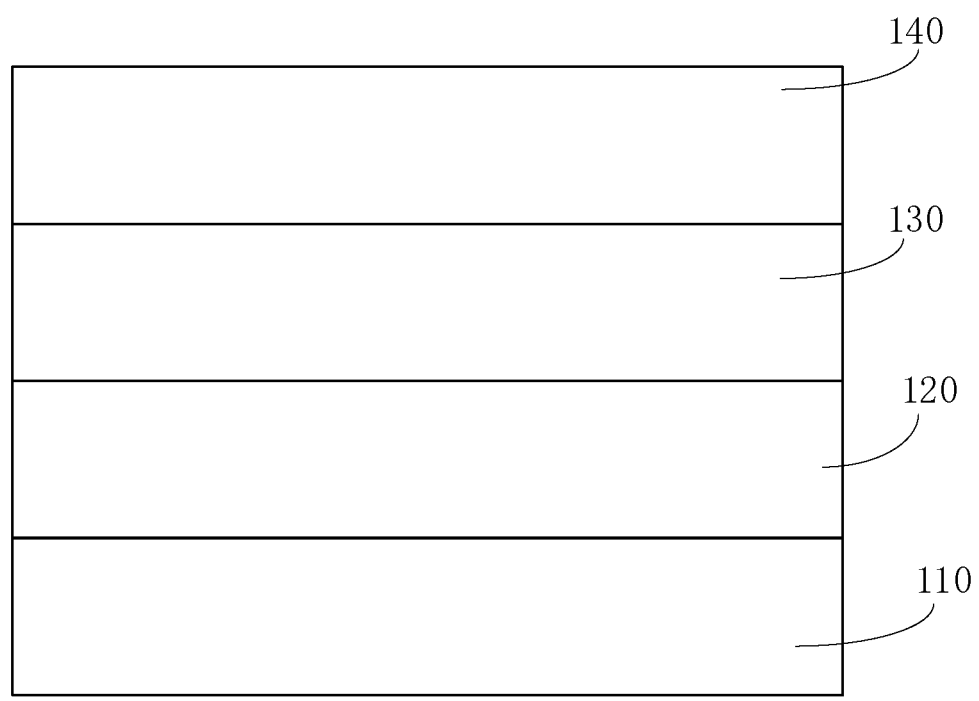
FIG. 6 is a cross-sectional view of a PMOLED display panel according to an embodiment.

Optionally, the aforementioned display panel is a passive-matrix organic light-emitting diode (PMOLED) display panel. At this time, the display panel further includes a second electrode 140 stacked with the first electrode 120, as shown in FIG. 6. An insulating layer 130 is disposed between the first electrode 120 and the second electrode 140. The insulating layer 130 is configured to achieve electrical insulation between the first electrode 120 and the second electrode 140. The insulating layer is an inorganic insulating layer or an organic insulating layer, and may also be a composite structure containing both an organic layer and an inorganic layer. In order to improve the light transmittance of the display panel, the insulating layer is preferably made of $SiO_2$, $SiN_x$, $Al_2O_3$, or the like.

Figure 7:
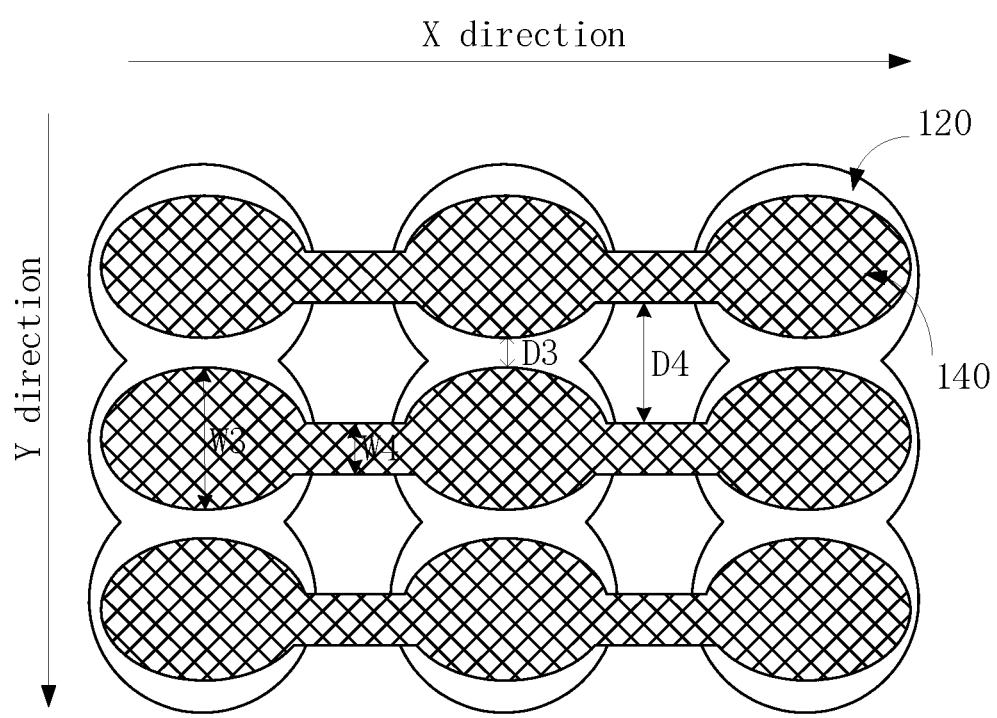
FIG. 7 is a schematic view of an anode and a cathode in a PMOLED display panel according to an embodiment.

An extending direction of the second electrode 140 is perpendicular to the extending direction of the first electrode 120, thereby forming a light emitting area of the display panel in the overlapping area, as shown in FIG. 7. The first electrode 120 is an anode and the second electrode 140 is a cathode. Generally, one pixel (or pixel unit) includes at least three sub-pixels of red, green, and blue. In the present embodiment, each anode is configured to drive a row/column of sub-pixels or a plurality of rows/columns of sub-pixels. Optionally, one pixel unit may also include four sub-pixels of red, green, blue, and white. The arrangement of the sub-pixels may be RGB sub-pixels parallel arrangement, V-shaped arrangement, PenTile arrangement, and the like. In the present disclosure, pixel units in which RGB sub-pixels are arranged in parallel are taken as an example for illustration. The display panel in present embodiment may also be applied to other arrangements besides the RGB sub-pixels parallel arrangement.

Optionally, each anode is configured to drive all the sub-pixels in a row/column of pixel units. That is, in the present embodiment, each anode is used to drive three columns of sub-pixels of red, green, and blue in a row/column of pixel units. At this time, the shape of the anode adopts the shape shown in FIG. 2, that is, two sides of the anode in the extending direction are both wavy, and crests T of the two sides are oppositely disposed and troughs B of the two sides are oppositely disposed. Therefore, there is a maximum width W1 between the opposite crests T and a minimum width W2 between the opposite troughs B. The width W1 between the opposite crests T ranges from 30 micrometers to (A−X) micrometers, and the width W2 between the opposite troughs B ranges from X micrometers to W1. A is a pixel size, X is a minimum process dimension, and the A is greater than (30+X) micrometers. The pixel size A needs to be determined according to the size of the display panel and the total number of pixels on the display panel. X is the minimum process dimension, which is 4 micrometers in the present embodiment, and can be smaller in other embodiments.

Optionally, the pixels are all square pixels, that is, the pixels have the same size in both length and width. At this case, the pixel size A is equal to the square root of the area of the display panel divided by the total number of pixels. Optionally, the width between the opposite troughs B may also be less than 4 micrometers, as long as the manufacturing process capability can achieve and meet the requirements of electrical characteristics (such as resistance characteristics) and the like. In another embodiment, the anodes are regularly arranged on the substrate 110, that is, the distance between two adjacent anodes is fixed, so that the interval between the two adjacent anodes also changes with the width of the anodes. Therefore, the two anodes have a minimum interval D1 between the opposite crests and a maximum interval D2 between the opposite troughs. The minimum interval D1 is (A−W1). The maximum interval D2 is (A−W2).

Optionally, a shape of the cathode is the same as a shape of the anode, and both of which are wavy. At this case, the cathode is the same as the anode, which is used to drive all the sub-pixels in a row/column of pixel units, so as to control all the sub-pixels in the same row/column of pixel units. In the figure, the illustration is given by taking only the plurality of first electrodes (i.e. anodes) arranged along the X direction and the plurality of second electrodes (i.e. cathodes) sequentially arranged along the Y direction as an example.

Optionally, the cathode is an electrode structure having a strip-shaped connecting portion at the two opposite troughs, as shown in FIG. 7. At this case, the cathode also has a maximum width W3 between the opposite crests of the two sides thereof and a minimum width W4 between the opposite troughs of the two sides thereof. Similarly, the two adjacent cathodes has a minimum interval D3 at the crests and a maximum interval D4 at the troughs. At this case, W3 is (W1−X) micrometers, and W2 ranges from X micrometers to W3 micrometers. X is the minimum process dimension, which is 4 micrometers in the present embodiment and can be smaller in other embodiments. The dimensions of the anode and cathode may be set as required, and the above embodiments do not constitute the only limitations of the present disclosure.

Optionally, the number of columns/rows of pixels correspondingly driven by each cathode is M, and the number of columns/rows of pixels correspondingly driven by each anode is N, then M should be greater than or equal to 3 times of N. Specifically, one pixel unit is formed by using RBG sub-pixels, and the number of columns/rows M of the sub-pixels correspondingly driven by the cathode is 3 times of N. Optionally, if one pixel unit is formed by using RGBW sub-pixels, the number of columns/rows M of the sub-pixels correspondingly driven by the cathode is 4N. In other embodiments, the column pixels may be driven by the cathode and the row pixels may be driven by the anode, with the only difference being the arrangement directions of the anode and the cathode.

Figure 8:
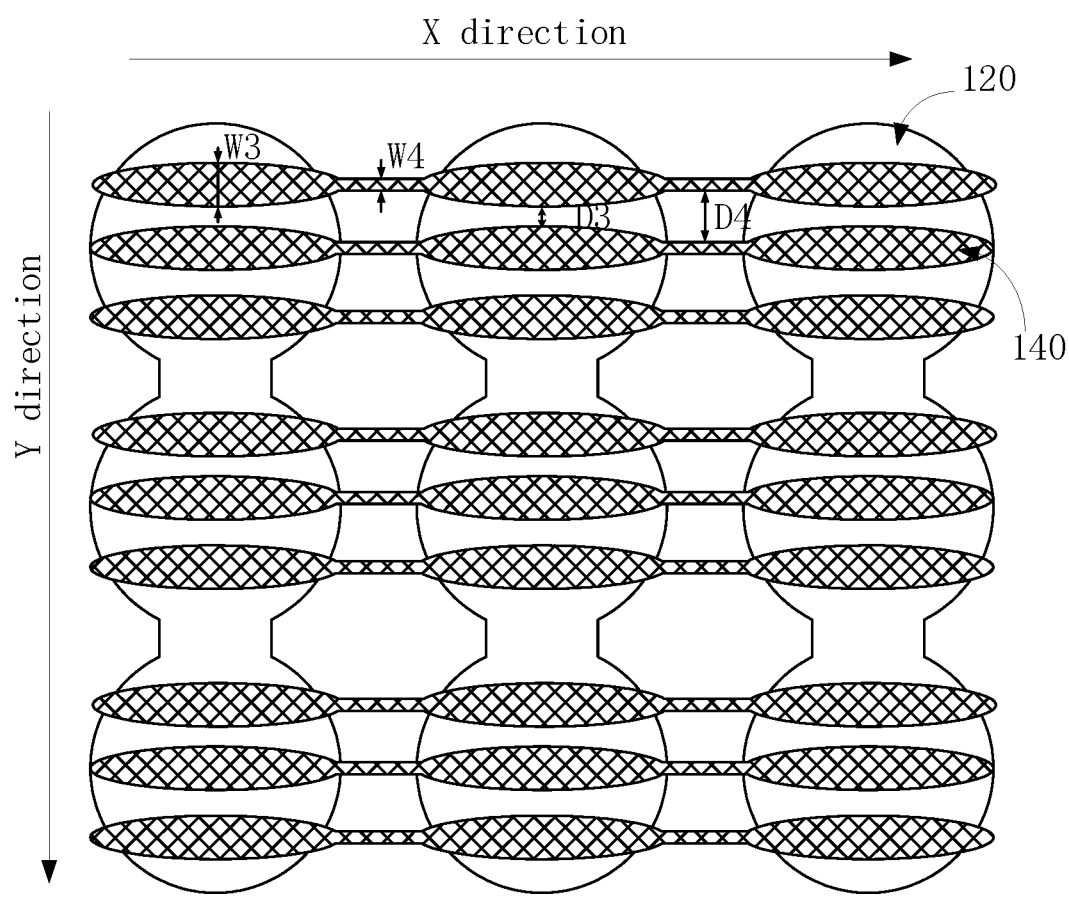
FIG. 8 is a schematic view of an anode and a cathode in a PMOLED display panel according to FIG. 7 with different shape of the first electrode.

FIG. 8 is a schematic view of a cathode and an anode in a PMOLED display panel according to another embodiment. At this case, one pixel unit includes three sub-pixels of red, green, and blue. Therefore, each anode 120 is used to drive a column of pixel units and each cathode 140 is used to drive a row of sub-pixels. The pattern and dimension of the anode can be referred to FIG. 2, that is, the width W1 between the opposite crests T ranges from 30 micrometers to (A−X) micrometers, the width W2 between the opposite troughs B ranges from X micrometers to W1, the minimum interval D1 is (A−W1), and the maximum interval D2 is (A−W2). X is the minimum process dimension.

Referring to FIG. 8, the width W3 between the opposite crests of the two sides of the cathode ranges from X micrometers to ((A−X)/3) micrometers. In other embodiments, when the number of the sub-pixels in one pixel unit is N, the width W3 between the opposite crests T of the two sides of the cathode 140 ranges from X micrometers to ((A−X)/N) micrometers. In the present embodiment, the width W4 between the opposite troughs of the two sides of the cathode 140 ranges from X micrometers to W1, the minimum interval D3 is (A−W3), and the maximum interval D4 is (A−W4). A is the pixel size and X is the minimum process dimension. In the above embodiments, the interval between adjacent electrodes is between 4 micrometers and 20 micrometers.

In another embodiment, the anode in FIG. 8 can also be used as a cathode and the cathode can be used as an anode, that is, each cathode is used to drive a column of sub-pixels, and each anode is used to drive all the sub-pixels in a row of pixel units.

In another embodiment, the aforementioned display panel may also be an active-matrix organic light-emitting diode (AMOLED) display panel. At this case, the substrate 110 is a thin film transistor (TFT) array substrate. The first electrode includes various conductive traces disposed on the TFT array substrate. The width of the first electrode needs to be designed according to the width design of the conductive trace. The conductive trace includes at least one of a scanning line, a data line, and a power line. For example, all conductive traces such as scanning lines, data lines, and power lines on the TFT array substrate may be modified to adopt the shape of the electrode as shown in FIG. 2. The conductive traces on the TFT array substrate are changed to the wavy shape of the electrode in FIG. 2, so that diffraction fringes with different positions can be formed when light passes through positions of different widths and different gaps of adjacent traces in an extending direction of the conductive trace. Diffraction effects at different positions are mutually counteracted, and then the diffraction effect is weakened, so that a photosensitive device placed under the TFT array substrate can normally operate.

Figure 9:
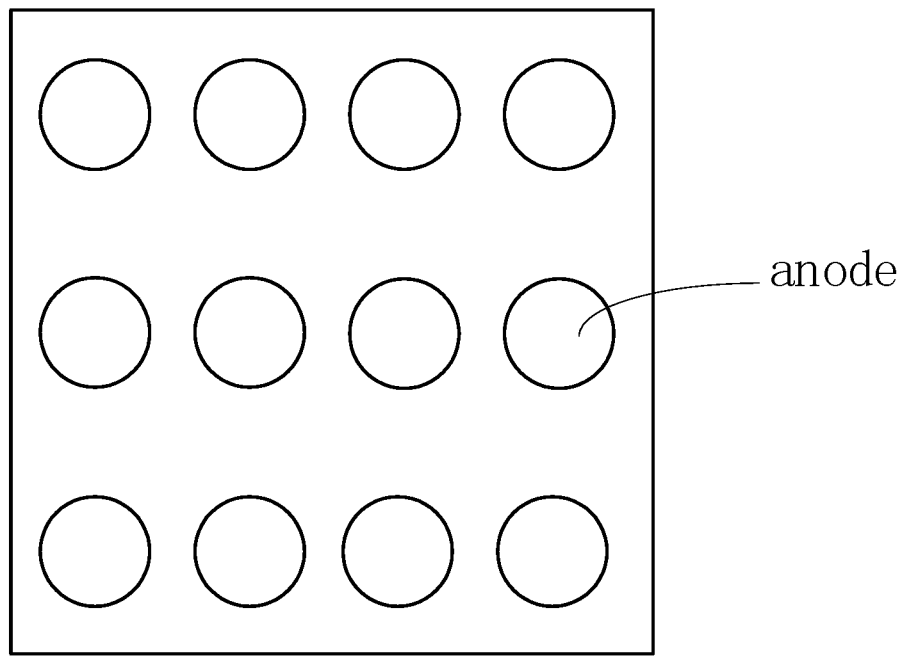
FIG. 9 is a schematic view of an anode in an AMOLED display panel according to an embodiment.
Figure 10:
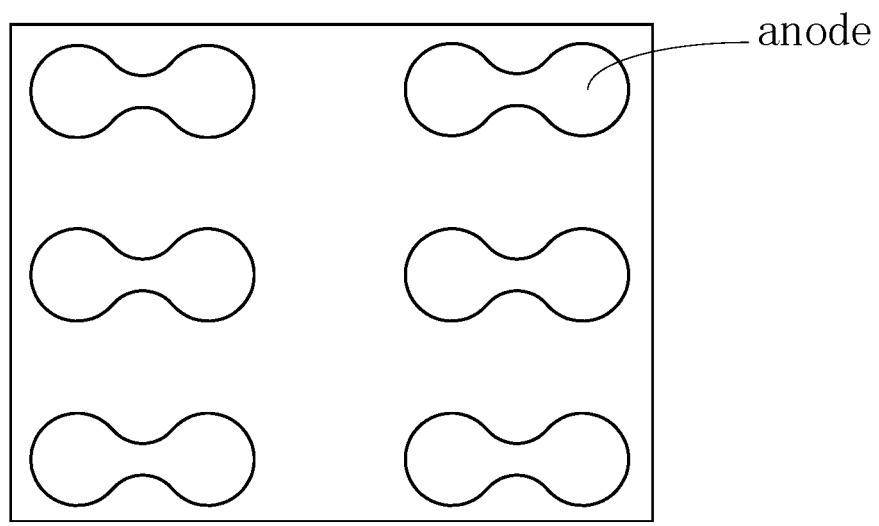
FIG. 10 is a schematic view of an anode in an AMOLED display panel according to FIG. 9 with different shape of the anode.

Optionally, when the display panel is an active-matrix organic light-emitting diode (AMOLED) display panel, the display panel further includes an anode layer disposed above the substrate. The anode layer includes an anode array. The anode array consists of a plurality of mutually independent anodes. The anode may have a circular shape, elliptical shape, or dumbbell shape. FIG. 9 is a schematic view of an anode array formed using circular anodes. FIG. 10 is a schematic view of an anode array formed using dumbbell anodes. By changing the shape of the anode into the circular shape, the elliptical shape, or the dumbbell shape, diffraction fringes with different positions and diffusion directions can also be generated at positions of different widths of the anode when light passes through the anode layer, and the diffraction fringes at different positions and in different directions are mutually counteracted, so that the diffraction effect is weakened. In addition, each of the sub-pixels may also be arranged in a circular, elliptical, or dumbbell shape as shown in FIG. 9 and FIG. 10 to weaken the diffraction effects. Moreover, the area of each of the sub-pixels can be enlarged to the maximum extent by the circular shape, the elliptical shape, or the dumbbell shape, and the light transmittance is further improved.

Optionally, the aforementioned display panel may be a transparent or transflective display panel. The transparency of the display panel can be achieved by using various layers of materials with better light transmittance. For example, each layer is made of a material having a light transmittance of greater than 90%, so that the light transmittance of the entire display panel may be greater than 70%. In addition, each structure film layer is made of a material having a light transmittance of greater than 95%, so that the light transmittance of the display panel is further improved, and even the light transmittance of the entire display panel is greater than 80%. Specifically, the conductive traces such as the cathode and the anode may be made of ITO, IZO, Ag+ITO, or Ag+IZO, etc., the insulating layer is preferably made of $SiO_2$, $SiN_x$, $Al_2O_3$, etc., and the pixel definition layer 140 is made of a highly transparent material.

The transparency of the display panel can also be achieved by other technical means, and structures of the aforementioned display panels can be applicable. The transparent or transflective display panel can display the picture normally when it is in an operation state. When the display panel is in other functional demand states, external light can irradiate the photosensitive device and the like disposed under the display panel through the display panel.

An embodiment of the present disclosure further provides a display screen. The display screen has at least one display area. Each display area is configured to display dynamic or static pictures. At least one display area includes a first display area. The first display area is provided with the display panel as mentioned in any of the foregoing embodiments. A photosensitive device may be disposed under the first display area. Since the display panel in the foregoing embodiment is adopted in the first display area, when light passes through the display area, no obvious diffraction effect is generated, so that the photosensitive device located under the first display area can be ensured to operate normally. The first display area may display dynamic or static pictures normally when the photosensitive device is not in operation, and the first display area changes along with the change of the display content of the whole display screen, such as displaying an external image being captured when the photosensitive device is in operation. Alternatively, when the photosensitive device is in operation, the first display area may also be in a non-display state, so that the photosensitive device can be further ensured to normally perform light collection through the display panel.

Figure 11:
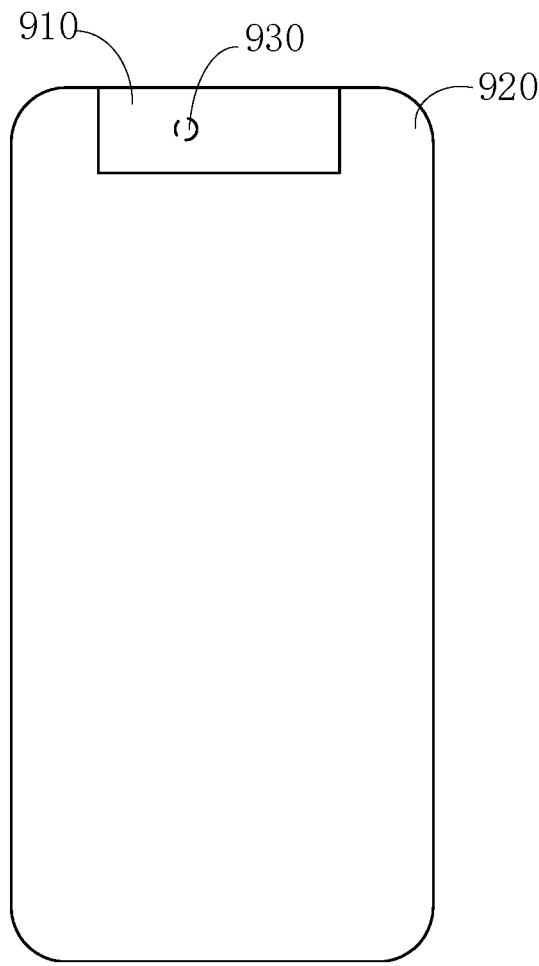
FIG. 11 is a schematic view of a display screen according to an embodiment.

FIG. 11 is a schematic view of a display screen according to an embodiment, and the display screen includes a first display area 910 and a second display area 920. A light transmittance of the first display area 910 is greater than that of the second display area 920. A photosensitive device 930 may be disposed under the first display area 910. The first display area 910 is provided with a display panel as mentioned in any of the foregoing embodiments. Both the first display area 910 and the second display area 920 are used to display static or dynamic pictures. Since the display panel in the foregoing embodiments is adopted in the first display area 910, when light passes through the display area, no obvious diffraction effect is generated, so that the photosensitive device 930 located under the first display area 910 can be ensured to work normally. The first display area 910 may display dynamic or static pictures normally when the photosensitive device 930 is not in operation, and the first display area 910 may be in a non-display state when the photosensitive device 930 is in operation, thereby ensuring that the photosensitive device 930 can perform light collection normally through the display panel. Optionally, the light transmittance of the first display area 910 may also be the same as the light transmittance of the second display area 920, so that the entire display panel has better light transmittance uniformity, ensuring a better display effect of the display panel.

Optionally, the display panel disposed in the first display area 910 is a PMOLED display panel or an AMOLED display panel, and the display panel disposed in the second display area 920 is an AMOLED display panel, thereby forming a full screen composed of a PMOLED display panel and an AMOLED display panel.

Figure 12:
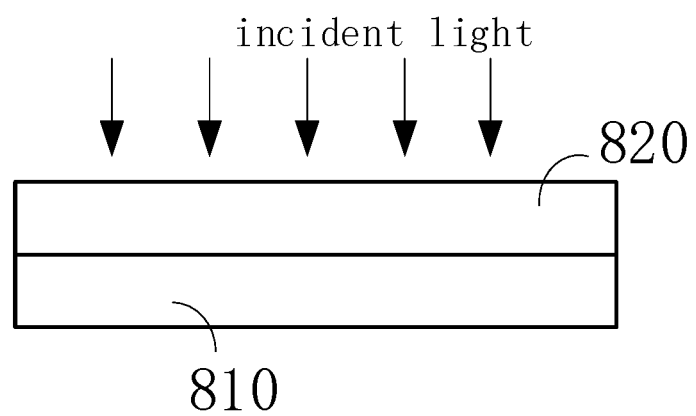
FIG. 12 is a schematic view of a display terminal according to an embodiment.

Another embodiment of the present disclosure further provides a display terminal. FIG. 12 is a schematic view of the display terminal in accordance with an embodiment, and the display terminal includes a device body 810 and a display screen 820. The display screen 820 is disposed on the device body 810 and is interconnected with the device body 810. The display screen 820 may use a display screen in any of the foregoing embodiments to display a static or dynamic picture.

Figure 13:
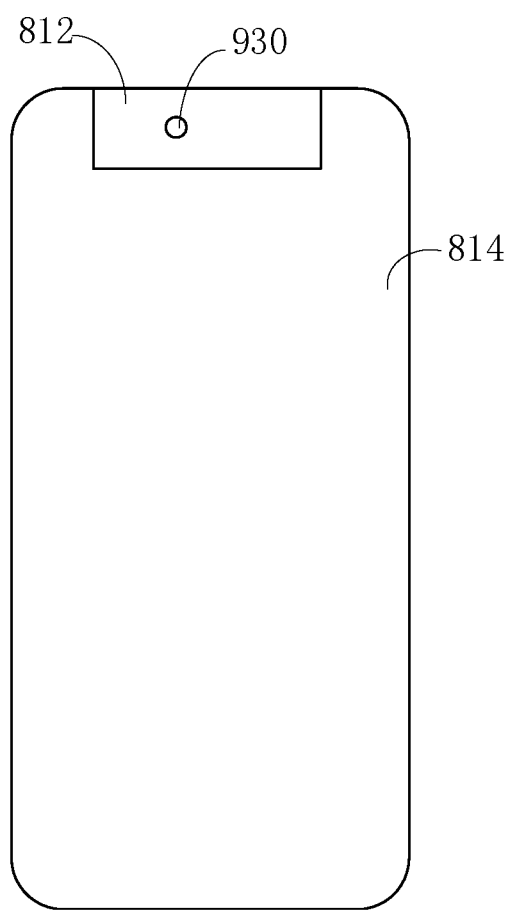
FIG. 13 is a schematic view of a device body according to an embodiment.

FIG. 13 is a schematic view of the device body 810 in accordance with an embodiment. In the present embodiment, the device body 810 may be provided with a notched area 812 and a non-notched area 814. Photosensitive devices such as cameras 930, optical sensors, and the like may be disposed in the notched area 812. At this case, the display panel in the first display area of the display screen 820 is correspondingly attached to the notched area 814, so that the aforementioned photosensitive devices such as the camera 930, the optical sensor, and the like can perform operations such as external light collection and the like through the first display area. Since the display panel in the first display area can effectively improve the diffraction phenomenon generated by the transmission of the external light through the first display area, the quality of the image captured by the camera 930 on the display device can be effectively improved, the distortion of the captured image caused by diffraction can be avoided, and the accuracy and the sensitivity of the optical sensor to sense external light can also be improved.

The aforementioned electronic device may be a digital device such as a mobile phone, a tablet, a palmtop computer, an ipod, and the like.

Although the respective embodiments have been described one by one, it shall be appreciated that the respective embodiments will not be isolated. Those skilled in the art can apparently appreciate upon reading the disclosure of the present disclosure that the respective technical features involved in the respective embodiments can be combined arbitrarily between the respective embodiments as long as they have no collision with each other. The respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

The invention claimed is:

1. A display panel, comprising:
   a substrate; and
   a plurality of first electrodes disposed on the substrate, the plurality of first electrodes comprising a first electrode having a wavy shape, the plurality of first electrodes extending toward a same direction, and having an interval between two adjacent first electrodes, which are not contact with each other, of the plurality of the first electrodes, in an extending direction of the first electrode, a width of the interval changing continuously,
wherein at least a part of the interval is characterized by a straight edge and a curved edge.

2. The display panel according to claim 1, wherein both sides of the first electrode in the extending direction of the first electrode are wavy, crests of the two sides are disposed at opposite sides, and troughs of the two sides are disposed at opposite sides, and the width of the interval is changable, to make diffraction effects at different positions mutually counteracted.

3. The display panel according to claim 2, wherein a connecting portion is disposed at the opposite troughs of the first electrode, and the connecting portion has a strip shape.

4. The display panel according to claim 2, wherein:
the display panel is a passive-matrix organic light-emitting diode (PMOLED) display panel;
the display panel further comprises a second electrode stacked with the first electrode, and an extending direction of the second electrode is perpendicular to the extending direction of the first electrode.

5. The display panel according to claim 4, wherein first electrode is an anode, the second electrode is a cathode, and each anode is configured to drive a row/column of sub-pixels or a plurality of rows/columns of sub-pixels.

6. The display panel according to claim 5, wherein:
the anode is configured to drive a row/column of pixels; one pixel comprises at least three sub-pixels; a width between opposite crests of two sides of the anode is within 30 micrometers to (A-X) micrometers; a width between opposite troughs of two sides of the anode is greater than X and less than the width between the opposite crests, A being a pixel size, X being a minimum process dimension, and the A being at least (30+X) micrometers.

7. The display panel according to claim 5, wherein:
the anode is configured to drive a row/column of sub-pixels; a width between opposite crests of two sides of the anode ranges from X micrometers to ((A−X)/N) micrometers; a width between opposite troughs of two sides of the anode is greater than X and less than the width between the opposite crests, A being a pixel size, X being a minimum process dimension, and N being equal to the number of columns/rows of the sub-pixels comprised in each pixel.

8. The display panel according to claim 7, wherein the number of rows/columns of the sub-pixels driven by one anode is N, the number of columns/rows of the sub-pixels driven by one cathode is M, and M is greater than or equal to 3 times of N.

9. The display panel according to claim 5, wherein both sides of the cathode in an extending direction thereof are wavy, crests of the two sides are oppositely disposed, and troughs of the two sides are oppositely disposed; a connecting portion is disposed at the opposite troughs of the cathode, and the connecting portion has a strip shape.

10. The display panel according to claim 9, wherein the number of columns/rows of pixels driven by one cathode is equal to the number of rows/columns of pixels driven by one anode; a width W3 between the opposite crests of the two sides of the cathode is (W1−X) micrometers; a width W4 of the connecting portion of the cathode is greater than X and less than the width between the opposite crests of the cathode; wherein W1 is a width between opposite crests of two sides of the anode, X is a minimum process dimension; or
wherein the number of rows/columns of the sub-pixels driven by one anode is N, the number of columns/rows of the sub-pixels corresponding to one cathode is M, and M is greater than or equal to 3 times of N; the width between the opposite crests of the two sides of the cathode ranges from X micrometers to ((A−X)÷) micrometers; the width of the connecting portion of the cathode is greater than X and less than the width between the opposite crests of the cathode; wherein A is a pixel size and X is a minimum process dimension.

11. The display panel according to claim 1, wherein the first electrode is provided with a plurality of protrusions distributed along an edge of the first electrode.

12. A display screen having at least one display area, the at least one display area comprising a first display area, and a photosensitive device disposed under the first display area;
wherein the display panel according to claim 1 is disposed in the first display area, and each display area is configured to display a dynamic or static picture.

13. The display panel according to claim 1, wherein the display panel is an active-matrix organic light-emitting diode (AMOLED) display panel, and the substrate is a thin film transistor (TFT) array substrate; the first electrode comprises various conductive traces on the TFT array substrate.

14. A display panel, comprising:
a substrate; and
a plurality of first electrodes disposed on the substrate, the plurality of first electrodes including three selected first electrodes, at least two of the three selected first electrodes respectively being a wavy shape, the three selected first electrodes having two intervals respectively between every two adjacent ones of the three selected first electrodes, the three selected first electrodes and the two intervals extending towards a same direction,
widths of the two intervals respectively changing continuously, and the two intervals are substantially symmetrical with respect to an imaginary middle line of a middle one of the three selected first electrodes, the imaginary middle line and the two intervals extending along the same direction,
the display panel is an active-matrix organic light-emitting diode (AMOLED) display panel, and the substrate is a thin film transistor (TFT) array substrate.

15. The display panel according to claim 14, wherein a width of the selected first electrode changing continuously or intermittently, both sides of the selected first electrode in the extending direction of the first electrode are wavy, crests of the two sides are oppositely disposed, and troughs of the two sides are oppositely disposed.

16. The display panel according to claim 14, wherein the first electrode comprises various conductive traces on the TFT array substrate.

17. The display panel according to claim 16, the conductive trace comprises at least one of a scanning line, a data line, and a power line.

18. The display panel according to claim 14, wherein the widths of two intervals respectively changing to make diffraction effects at different positions mutually counteracted.

19. A display panel, comprising:
a substrate; and a plurality of first electrodes disposed on the substrate, the plurality of first electrodes being wavy shape, the plurality of first electrodes comprising a first electrode,
wherein the display panel is an active-matrix organic light-emitting diode (AMOLED) display panel, and the substrate is a thin film transistor (TFT) array substrate; the first electrode comprises various conductive traces on the TFT array substrate, the conductive traces are made of conductive material;
wherein a width of an interval between two adjacent conductive traces changing continuously.

20. A display screen having at least one display area, the at least one display area comprising a first display area, and a photosensitive device disposed under the first display area;
wherein the display panel according to claim 19 is disposed under the plurality of first electrodes in the first display area, and each display area is configured to display a dynamic or static picture.

21. The display panel according to claim 19, wherein a radian of the conductive trace changing continuously, the conductive traces are made of transparent conductive material, the width of the interval between two adjacent conductive traces changing continuously to make diffraction effects at different positions mutually counteracted.

* * * * *